(12) United States Patent
Auchere et al.

(10) Patent No.: US 9,949,381 B2
(45) Date of Patent: Apr. 17, 2018

(54) ELECTRONIC DEVICE WITH AT LEAST ONE IMPEDANCE-COMPENSATING INDUCTOR AND RELATED METHODS

(71) Applicant: STMICROELECTRONICS (GRENOBLE 2) SAS, Grenoble (FR)

(72) Inventors: David Auchere, St martin d'heres (FR); Laurent Marechal, Grenoble (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 377 days.

(21) Appl. No.: 14/330,176

(22) Filed: Jul. 14, 2014

(65) Prior Publication Data

US 2015/0016081 A1   Jan. 15, 2015

(30) Foreign Application Priority Data

Jul. 15, 2013   (FR) ...................... 13 56936

(51) Int. Cl.
| | |
|---|---|
| H05K 1/18 | (2006.01) |
| H05K 3/42 | (2006.01) |
| H01L 23/64 | (2006.01) |
| H01L 23/498 | (2006.01) |

(52) U.S. Cl.
CPC .......... *H05K 3/42* (2013.01); *H01L 23/49811* (2013.01); *H01L 23/49822* (2013.01); *H01L 23/49827* (2013.01); *H01L 23/645* (2013.01); *H01L 2224/16225* (2013.01); *H01L 2924/15311* (2013.01); *Y10T 29/4913* (2015.01)

(58) Field of Classification Search
CPC ................. H01L 23/50; H01L 23/5383; H01L 23/49822; H01L 23/49838
USPC .................................................. 361/767–784
See application file for complete search history.

(56) References Cited

U.S. PATENT DOCUMENTS

| | | | |
|---|---|---|---|
| 2,907,924 A | 10/1959 | Lutton | |
| 6,218,729 B1* | 4/2001 | Zavrel, Jr. | ........... H01L 23/5383 257/531 |
| 6,310,386 B1* | 10/2001 | Shenoy | .................. H01L 23/50 257/531 |
| 6,362,525 B1* | 3/2002 | Rahim | ............. H01L 23/49838 257/528 |
| 6,483,692 B2 | 11/2002 | Figueroa et al. | |
| 6,636,416 B2 | 10/2003 | Li et al. | |
| 6,713,860 B2 | 3/2004 | Li | |
| 6,787,920 B2 | 9/2004 | Amir | |
| 6,907,658 B2 | 6/2005 | Li | |
| 7,358,607 B2 | 4/2008 | Figueroa et al. | |
| 7,544,064 B2 | 6/2009 | Gilliland | |

(Continued)

FOREIGN PATENT DOCUMENTS

| | | |
|---|---|---|
| EP | 2290687 | 3/2011 |
| WO | 0004595 A2 | 1/2000 |

(Continued)

*Primary Examiner* — Tuan T Dinh
(74) *Attorney, Agent, or Firm* — Slater Matsil, LLP

(57) ABSTRACT

An electronic device includes a substrate having an external surface, and an integrated circuit over the external surface of the substrate. The substrate is provided with an electrical connection network including electrical links for linking the integrated circuit to another electrical device. Some of the electrical links include an impedance-compensating inductor on an external surface of the substrate.

20 Claims, 2 Drawing Sheets

(56) References Cited

U.S. PATENT DOCUMENTS

| | | |
|---|---|---|
| 8,821,188 B2 | 9/2014 | Chang et al. |
| 2005/0178582 A1 | 8/2005 | Lee et al. |
| 2005/0212134 A1 | 9/2005 | Pu |
| 2005/0218516 A1 | 10/2005 | Lloyd et al. |
| 2006/0055049 A1 | 3/2006 | Nelson et al. |
| 2006/0180905 A1 | 8/2006 | Zeng et al. |
| 2008/0129394 A1 | 6/2008 | Kissing et al. |
| 2008/0157295 A1 | 7/2008 | Nuytkens et al. |
| 2008/0202799 A1 | 8/2008 | Graydon et al. |
| 2009/0079530 A1 | 3/2009 | Chandrasekhar et al. |
| 2009/0215287 A1 | 8/2009 | Mori et al. |
| 2010/0096725 A1* | 4/2010 | Shi .................. H01L 23/49822 257/531 |
| 2010/0246149 A1 | 9/2010 | Nakashima et al. |
| 2011/0085311 A1 | 4/2011 | Chen |
| 2011/0188193 A1 | 8/2011 | Yi |
| 2011/0273240 A1 | 11/2011 | Lin |
| 2012/0037411 A1 | 2/2012 | Hsu et al. |
| 2013/0208434 A1 | 8/2013 | Alm |

FOREIGN PATENT DOCUMENTS

| | | | |
|---|---|---|---|
| WO | 2007114224 | A1 | 10/2007 |
| WO | 2008097911 | A1 | 8/2008 |

* cited by examiner

US 9,949,381 B2

ELECTRONIC DEVICE WITH AT LEAST ONE IMPEDANCE-COMPENSATING INDUCTOR AND RELATED METHODS

TECHNICAL FIELD

The present disclosure relates to the field of electronic devices including integrated circuits and related methods.

BACKGROUND

Generally, an electrical connection network comprises electrical connection tracks (i.e. traces) linked to the integrated circuit chip, for example, by way of electrical connection beads (balls) or columns (vias). When the printed circuit board is placed on the other side of the substrate board bearing the integrated circuit chip, the traces are linked to the printed circuit board by way of electrical connection vias passing through the substrate board and of electrical connection beads or columns.

When the printed circuit board is placed on the same side of the substrate board as the integrated circuit chip, the electrical connection traces are directly linked to the printed circuit board by way of electrical connection beads or columns. In the case where electrical connection traces are used for the transfer of high-frequency digital signals, which are required to have ever sharper edges, the above devices may degrade digital signals.

SUMMARY

The present disclosure may improve electrical links between integrated circuit chips carried by substrates and other electric devices.

An electronic device may comprise a substrate, and at least one integrated circuit assembled on the substrate. The substrate may be provided with an electrical connection network comprising a plurality of electrical links for linking the integrated circuit to another electric device, and in which at least one of the electrical links comprises at least one impedance-compensating inductor.

The electrical link may comprise an electrical connection trace and an external electrical connection element, the inductor being placed between this trace and this element. The inductor may comprise a coil formed flat onto the substrate board and around an electrical connection region. The electrical connection region may be placed at one end of an electrical connection via passing through the substrate board. The inductor may be incorporated into a specific attached electrical connection component, for example, inserted in a through-passageway of the substrate board. The electrical link may comprise a transmission line for high-frequency digital signals.

BRIEF DESCRIPTION OF THE DRAWINGS

Some electronic devices will now be described by way of non-limiting examples, illustrated by the drawing in which.

DETAILED DESCRIPTION

Figure 1:
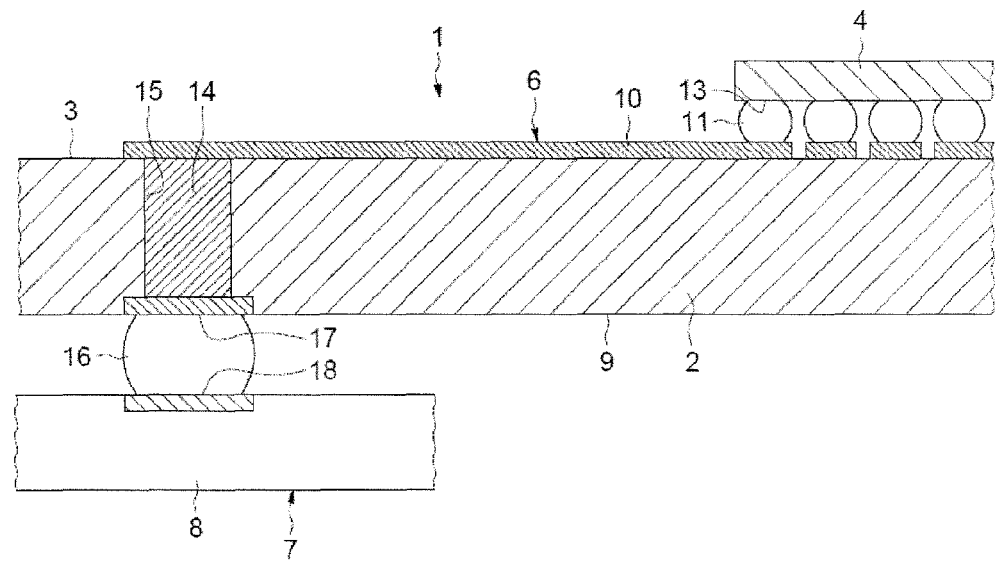
FIG. 1 is a schematic diagram of a cross-sectional view of an assembly of an electronic device.
Figure 2:
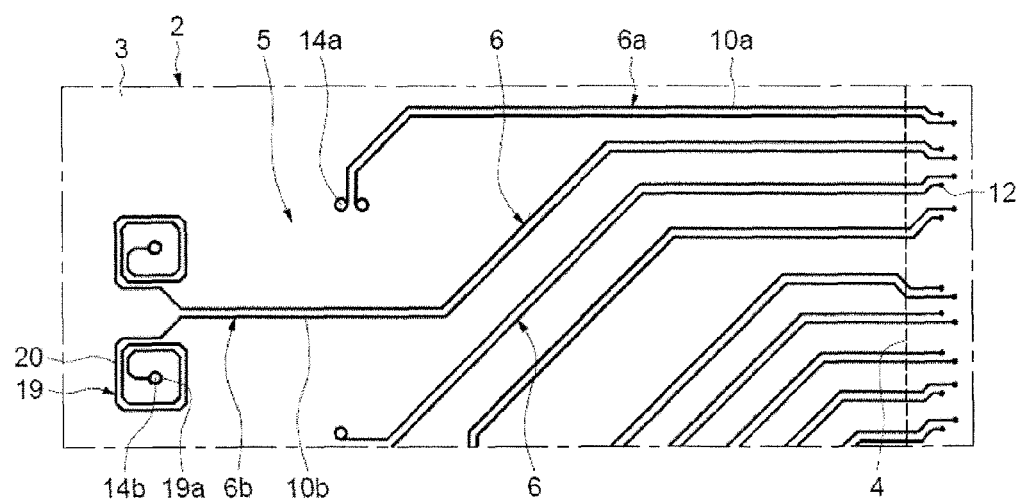
FIG. 2 is a top plan view of a substrate of the electronic device in FIG. 1.

An electronic device 1 shown in FIGS. 1 and 2 comprises a substrate board (i.e. substrate) 2 made of an insulating material, which is provided, above a front face 3, with an integrated circuit chip 4. The substrate board 2 is provided with an electrical connection (i.e. electrical interconnect) network 5 comprising a plurality of electrical links 6 enabling the chip 4 to be linked to another electronic device 7, which comprises, for example, a printed circuit board 8 placed above a back face 9 of the substrate board opposite its front face 3.

Each electrical link 6 comprises an electrical connection trace 10 arranged on the front face 3 of the substrate board 2 and an electrical connection element 11, such as a bead, interposed between a front contact region 12 provided at one end 11 of the electrical connection trace 10 and a contact region 13 of the chip 4. Each electrical link 6 further comprises an electrical connection via 14 arranged in a passageway 15 passing through the substrate board 2, made of an electrically conductive material at least partly filling the passageway 15, and an external electrical connection element 16, such as a bead, interposed between a back contact region 17 provided on a back face of the electrical connection via 14 and a contact region 18 of the printed circuit board 8.

The plurality of electrical links 6 is divided into two groups of electrical links 6a and 6b. In the first group of electrical links 6a, the other end of the electrical connection trace 10a of each electrical link is directly linked to the corresponding electrical connection via 14a. In the second group of electrical links 6b, the other end of the electrical connection trace 10b of each electrical link is linked to the corresponding electrical connection via 14b by way of an impedance-compensating inductor 19, which comprises a coil 20 arranged on the front face 3 of the substrate board 3, which is formed at the same time as the electrical connection trace 10b and around an electrical connection region 19a placed on one end of the electrical connection via 14b.

The electrical links 6b can be specifically assigned to the transmission, in one direction and/or the other, of high-frequency signals, for example, video signals. The presence in these links 6b of the inductors 19, arranged as close as possible to the electrical connection vias 14, makes it possible to compensate for the drops in impedance due, in particular, to the existence of the electrical connection vias 14 and the electrical connection elements 16, by raising them in such a way that the values of the impedances in the electrical links 6b are, for example, above a determined threshold.

Figure 3:
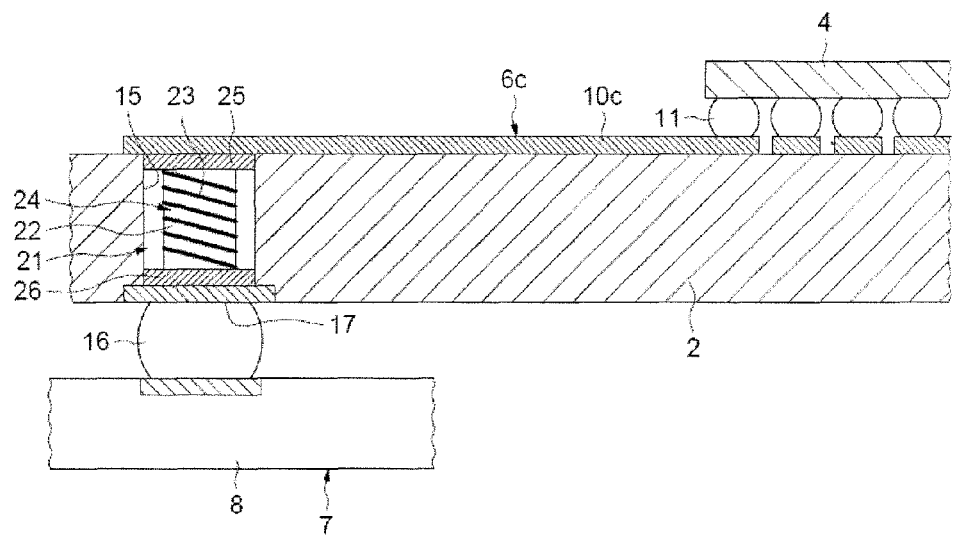
FIG. 3 is a schematic diagram of a cross-sectional view of another embodiment of the electronic device.

In another embodiment illustrated in FIG. 3, each electrical link of a group of electrical links 6c, equivalent to those of the group of electrical links 6b but without the presence of the inductor 19, comprises a specific electrical connection component 21 inserted in the through-passageway 15 of the substrate board 2, in place of the corresponding electrical connection via.

The specific electrical connection component 21, which can be of CMS or surface mount device (SMD) type, can comprise, in an embodiment, a cylindrical base 22 that bears, on its periphery, a wire coil 23 forming an impedance-compensating inductor 24 and comprises a front electrical connection pad 25 and a back electrical connection pad 26 which are linked to the ends of the inductor 24. This specific attached component could have a different structure.

Each electrical link 6c comprises an electrical connection trace 10c, which is linked directly to the front electrical connection pad 25 of the specific electrical connection component 21. Whereas, the back electrical connection pad 26 is linked to a back contact region 17c, on which an electrical connection element 16c such as a bead is placed.

Figure 4:
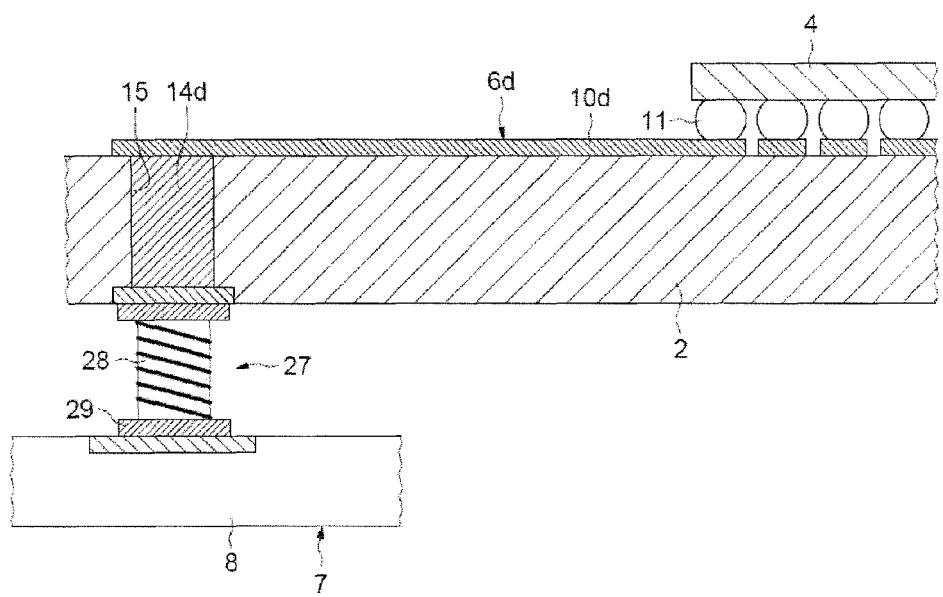
FIG. 4 is a schematic diagram of a cross-sectional view of another embodiment of the electronic device.

In another embodiment illustrated in FIG. 4, each electrical link of a group of electrical links 6d, equivalent to those of the group of electrical links 6b but also without the presence of the inductor 19, comprises an electrical connection via 14d, an electrical connection trace 10d linked directly to this via 14d, and a specific external electrical connection component 27, equivalent to the specific component 21, set out and attached in place of the corresponding external electrical connection back element. The specific electrical connection component 27 comprises an impedance-compensating inductor coil 28, linked to opposing electrical connection pads 29 and 30, the latter being linked to the electrical connection via 14d passing through the substrate board 2 and to the printed circuit board 8 respectively.

In another embodiment, the printed circuit board 8 could be placed on the same side of the substrate board 2 as the integrated circuit chip 4. In this case, the electrical connection vias 14 would be dispensed with and the electrical links would comprise electrical connection elements between the front face 3 of the substrate board 2 and the printed circuit board 8, either by electrical connection elements, such as beads, placed on the electrical connection regions 19a when an inductor equivalent to the inductor 9 was provided, or by specific components forming inductors equivalent to the specific components 27. The present embodiments are not limited to the examples described above. Other variants and other embodiments are possible without departing from the context of the present disclosure.

That which is claimed is:

1. An electronic device comprising:
    a substrate having an external surface;
    an integrated circuit (IC) chip electrically coupled to the external surface of the substrate by an external electrically conductive element disposed between the IC chip and the external surface of the substrate; and
    an electrically conductive interconnect network contacting the external surface of the substrate and comprising a plurality of electrically conductive links, each of the plurality of electrically conductive links extending away from a masking area of the IC chip, wherein an electrically conductive link of the plurality of electrically conductive links comprises an impedance-compensating inductor located outside the masking area of the IC chip, the impedance-compensating inductor having a first surface physically contacting the external surface of the substrate and a second surface directed away from the external surface of the substrate, the first surface of the impedance-compensating inductor physically contacting a conductive via extending through the substrate to electrically couple the IC chip to another electronic device.

2. The electronic device according to claim 1 wherein the electrically conductive link comprises an electrically conductive trace between the impedance-compensating inductor and the external electrically conductive element.

3. The electronic device according to claim 1 wherein the substrate defines an electrical connection region; and wherein the impedance-compensating inductor comprises a coil wrapping around the electrical connection region.

4. The electronic device according to claim 1 wherein the electrically conductive link comprises a transmission line for high-frequency signals.

5. The electronic device according to claim 1, wherein the second surface of the impedance-compensating inductor does not physically contact an electrically conductive material.

6. The electronic device according to claim 1, wherein the masking area of the IC chip corresponds to a lateral extent of the IC chip in a top-down view.

7. The electronic device according to claim 1, wherein the impedance-compensating inductor is located within a masking area of the another electronic device.

8. The electronic device according to claim 1, wherein the substrate is interposed between another electronic device and the inductor.

9. The electronic device according to claim 3 wherein the substrate comprises a dielectric layer, wherein the conductive via extends through the dielectric layer; and wherein the electrical connection region is adjacent to an end of the conductive via.

10. An electronic device assembly comprising:
    a first electronic device; and
    a second electronic device comprising
        a substrate having a front contact region at a first major surface of the substrate and a back contact region at a second major surface of the substrate opposite the first major surface, the first electronic device electrically coupled to the back contact region by a first external electrically conductive element interposed between the first electronic device and the back contact region of the substrate,
        an integrated circuit (IC) electrically coupled to the front contact region of the substrate by a second external electrically conductive element disposed between the IC and the front contact region of the substrate, and
        an electrically conductive interconnect network physically contacting the first major surface of the substrate and comprising a plurality of electrically conductive links, each of the plurality of electrically conductive links extending away from the IC and having ends located outside a boundary of the IC, wherein an electrically conductive link of the plurality of electrically conductive links comprises an inductor at an end of the electrically conductive link and physically contacting the first major surface of the substrate and located outside the boundary of the IC, the inductor located within a boundary of the first electronic device, the inductor comprising a first surface directed toward the first major surface of the substrate and a second surface directed away from the first major surface of the substrate, the first surface of the inductor physically contacting a conductive via extending through the substrate to electrically couple the IC to the first electronic device, the second surface of the inductor being exposed and not physically contacting an electrically conductive material.

11. The electronic device assembly according to claim 10 wherein the electrically conductive link comprises an electrically conductive trace between the inductor and the second external electrically conductive element.

12. The electronic device assembly according to claim 10 wherein the substrate defines an electrical connection region; and wherein the inductor comprises a coil physically contacting the substrate and wrapping around the electrical connection region.

13. The electronic device assembly according to claim 10 wherein the electrically conductive link comprises a transmission line for high-frequency signals.

14. The electronic device assembly according to claim 12 wherein the substrate comprises a dielectric layer, wherein the conductive via extends through dielectric layer; and wherein electrical connection region is adjacent an end of the conductive via.

15. A method for making an electronic device comprising:
forming a conductive via extending through a substrate from a first major surface of the substrate to a second major surface of the substrate;
forming an electrically conductive interconnect network extending on the first major surface of the substrate, the electrically conductive interconnect network comprising a plurality of electrically conductive links; and
electrically coupling, by an external electrically conductive element, an integrated circuit (IC) the electrically conductive interconnect network comprising a plurality of electrically conductive links, each of the plurality of electrically conductive links extending away from a masking area of the IC, wherein an electrically conductive link of the plurality of electrically conductive links comprises an inductor located outside the masking area of the IC, the inductor having a first surface physically contacting the first major surface of the substrate and a second surface directed away from the first major surface of the substrate, the first surface of the inductor physically contacting the conductive via to couple the IC to another electronic device, the second surface of the inductor not physically contacting an electrically conductive material.

16. The method according to claim 15 wherein the electrically conductive link comprises an electrically conductive trace between the inductor and the external electrically conductive element.

17. The method according to claim 15 wherein the substrate defines an electrical connection region; and wherein the inductor comprises a coil wrapping around the electrical connection region.

18. The method according to claim 15, wherein the electrically conductive link comprises a transmission line for high-frequency signals.

19. The method according to claim 16, wherein forming the electrically conductive interconnect network extending on the first major surface of the substrate comprises forming the electrically conductive trace and the inductor at the same time.

20. The method according to claim 17 wherein the substrate comprises a dielectric layer, and wherein the via extends through the dielectric layer; and wherein the electrical connection region is adjacent to an end of the conductive via.

* * * * *